(12) United States Patent
Lee et al.

(10) Patent No.: US 8,017,972 B2
(45) Date of Patent: Sep. 13, 2011

(54) MULTILAYERED WHITE LIGHT EMITTING DIODE USING QUANTUM DOTS AND METHOD OF FABRICATING THE SAME

(75) Inventors: Jae Ho Lee, Yongin-si (KR); Byeong Ki Kim, Gunpo-si (KR); Young Sic Kim, Seoul (KR)

(73) Assignee: Samsung LED Co., Ltd. (KR)

( * ) Notice: Subject to any disclaimer, the term of this patent is extended or adjusted under 35 U.S.C. 154(b) by 290 days.

(21) Appl. No.: 11/672,285

(22) Filed: Feb. 7, 2007

(65) Prior Publication Data

US 2007/0246734 A1  Oct. 25, 2007

(30) Foreign Application Priority Data

Apr. 10, 2006  (KR) ........................ 10-2006-0032318

(51) Int. Cl.
*H01L 33/00* (2010.01)
(52) U.S. Cl. ......................................... 257/103; 257/88
(58) Field of Classification Search .................... 257/14, 257/88–103, E33.072
See application file for complete search history.

(56) References Cited

U.S. PATENT DOCUMENTS

| | | | |
|---|---|---|---|
| 6,166,489 A * | 12/2000 | Thompson et al. | 313/506 |
| 6,281,525 B1 * | 8/2001 | Krijn et al. | 257/99 |
| 6,831,302 B2 * | 12/2004 | Erchak et al. | 257/87 |
| 6,890,777 B2 | 5/2005 | Bawendi et al. | |
| 6,914,265 B2 * | 7/2005 | Bawendi et al. | 257/98 |
| 7,318,651 B2 * | 1/2008 | Chua et al. | 362/11 |
| 7,459,846 B2 * | 12/2008 | Kang et al. | 313/503 |
| 2006/0091780 A1 * | 5/2006 | Minami | 313/495 |
| 2006/0097621 A1 * | 5/2006 | Park et al. | 313/485 |
| 2006/0214903 A1 * | 9/2006 | Kurosaka | 345/102 |
| 2006/0244358 A1 * | 11/2006 | Kim et al. | 313/486 |

FOREIGN PATENT DOCUMENTS

WO  9950983  10/1999

* cited by examiner

*Primary Examiner* — Cuong Q Nguyen
(74) *Attorney, Agent, or Firm* — Cantor Colburn LLP

(57) ABSTRACT

A multilayered white light emitting diode and a method of fabricating the same include forming a phosphor mixture layer including a green phosphor and a blue phosphor on a UV light emitting diode and forming a red quantum dot layer on the phosphor mixture layer. In the white light emitting diode of the present invention, the quantum dots are excited by green and blue visible light, thus increasing luminescence efficiency and realizing stable white light. Moreover, the white light emitting diode can be widely used as a light source having high output and high efficiency, thus being capable of substituting for a backlight unit of an illumination device or display device.

13 Claims, 5 Drawing Sheets

MULTILAYERED WHITE LIGHT EMITTING DIODE USING QUANTUM DOTS AND METHOD OF FABRICATING THE SAME

BACKGROUND OF THE INVENTION

This application claims priority to Korean Patent Application No. 10-2006-0032318, filed on Apr. 10, 2006, and all the benefits accruing therefrom under 35 U.S.C. §119, the contents of which in its entirety are herein incorporated by reference.

1. Field of the Invention

The present invention relates to a multilayered white light emitting diode ("LED") using quantum dots and a method of fabricating the same, and more particularly, to a multilayered white LED, in which a phosphor mixture layer composed of a green phosphor and a blue phosphor and a red quantum dot layer are sequentially formed on an ultra violet ("UV") LED such that quantum dots are excited by green and blue visible light, thereby increasing luminescence efficiency and realizing stable white light, and to a method of fabricating such a multilayered white LED.

2. Description of the Related Art

A white LED using a semiconductor, having advantages such as a long lifetime, a probability of decreasing the size thereof and operability at low voltage, is receiving attention as a next-generation LED capable of replacing a conventional LED.

In order to fabricate such a white LED, a method of using three-color (e.g., red, green, blue) LEDs has been conventionally proposed, but suffers because it results in a high fabrication cost and a large product size due to the complicated driving circuit.

Further, a white LED is realized in practice by combining an InGaN blue LED having a wavelength of 450 nm with a YAG:Ce phosphor, based on the principle in which part of the blue light generated from the blue LED excites the YAG:Ce phosphor to generate yellow-green light, which is then mixed with the blue light, thus emitting white light.

However, since light of the white LED, resulting from the combination of the blue LED and the YAG:Ce phosphor, has only part of the visible light spectrum, it has a low color rendering index and thus does not exhibit a desired color. Further, due to the 450 nm wavelength of the blue LED used as an excitation source, chip efficiency is decreased, leading to decreased overall luminescence efficiency of the white LED.

In order to solve the problems associated with the white LED, thorough attempts have been made to develop a white LED capable of emitting a white color similar to natural light by mixing red, green and blue phosphors using a UV LED as an excitation source.

That is, as shown in FIG. 1, there has been proposed a conventional technique of realizing white light by applying red, green and blue phosphors around a UV short-wavelength LED such that the red, green and blue phosphors are excited by the UV LED, having high energy, and thus respectively emit red, green and blue wavelengths. The red, green and blue phosphors emitting red, green and blue wavelengths are then mixed.

However, according to such a conventional technique, the properties of the white LED may be deteriorated, depending on phosphor conversion efficiency, self absorption, temperature, and use for a long period of time. In particular, the properties of the white LED are limited due to the low phosphor conversion efficiency of the red phosphor.

With the intention of solving the problems associated with the white LED using the above phosphors, a white quantum dot and colored LED are disclosed in U.S. Pat. No. 6,890,777 and Japanese Patent Laid-open Publication No. 2002-510899.

The white quantum dot and colored LED are composed of a primary light source, a host matrix and a population of quantum dots embedded in the host matrix, as shown in FIGS. 2A and 2B.

The population of the quantum dots, including a mixture of quantum dots respectively emitting light of predetermined wavelengths, may be provided in the form of a single layer, as shown in FIG. 2A, or may be provided in the form of separate layers, as shown in FIG. 2B. Such an LED may be constructed to have a large number of quantum dots, whereby substantially all light from the primary source is absorbed and the finally emitted radiation is produced only by luminescence of the quantum dots. Alternatively, such an LED may be constructed to have a smaller number of quantum dots, whereby the light emerging from the device consists of a mixture of light from the primary source unabsorbed to the quantum dots and of light produced by luminescence of the quantum dots.

However, since the quantum dots of the quantum dot LED are directly excited by UV light having high energy, leading to luminescence, such an LED cannot but have drastically decreased luminescence efficiency upon long exposure to UV light. Accordingly, the quantum dot LED is disadvantageous because it cannot be applied to devices which must be used for a long period of time.

Consequently, in the case of realizing white light using a UV high-output LED, there is a need for an LED having high luminescence efficiency and which is capable of stably maintaining white light.

BRIEF SUMMARY OF THE INVENTION

Accordingly, the present invention has been made keeping in mind the above problems occurring in the related art, and an aspect of the present invention is to provide a multilayered white LED having high luminescence efficiency, using red quantum dots, instead of a red phosphor having relatively low phosphor conversion efficiency, in the case of realizing a white LED using UV light as an excitation source.

Another aspect of the present invention is to provide a multilayered white LED, in which quantum dots are not directly excited by UV light but are excited by visible light emerging from blue and green phosphors excited by UV light, thereby stably maintaining white light.

A further aspect of the present invention is to provide a method of fabricating a multilayered white LED, having the properties mentioned above.

In order to accomplish the above aspect, the present invention provides a multilayered white LED, comprising a UV LED for emitting UV light; a phosphor mixture layer including a green phosphor and a blue phosphor, formed on the UV LED; and a red quantum dot layer formed on the phosphor mixture layer.

In addition, the present invention provides a method of fabricating a multilayered white LED, the method comprising forming a phosphor mixture layer for emitting green light and blue light on a UV LED chip for emitting UV light; and forming a red quantum dot layer on the phosphor mixture layer.

The multilayered white LED of the present invention has superior luminescence efficiency using a UV LED having a wavelength of about 400 nm, at which chip efficiency is maximized, as an excitation source, and using red quantum dots, instead of a red inorganic phosphor having relatively low luminescence efficiency at the above wavelength.

Further, in the multilayered white LED of the present invention, the red quantum dots are not directly excited by UV light, but are excited by blue and green visible light emerging from green and blue phosphors which completely absorb UV light emitted from the UV LED, thereby stably emitting white light without damage to the quantum dots due to UV light.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
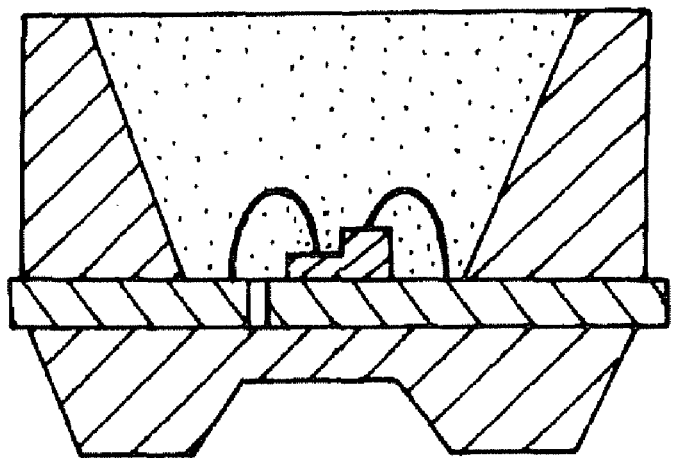
FIG. 1 is a schematic cross-sectional view showing a white LED using a phosphor, according to a conventional technique of the prior art.
Figure 2A:
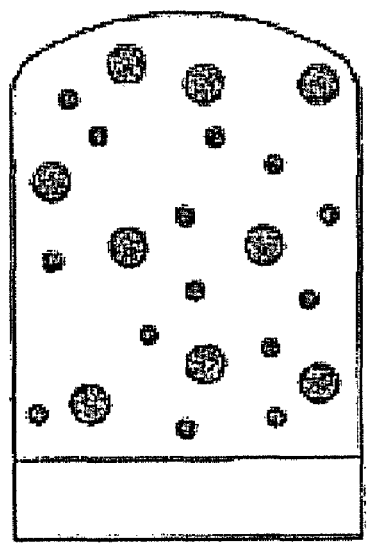
FIGS. 2A and 2B are schematic cross-sectional views showing the white LED using quantum dots, according to another conventional technique of the prior art.
Figure 2B:
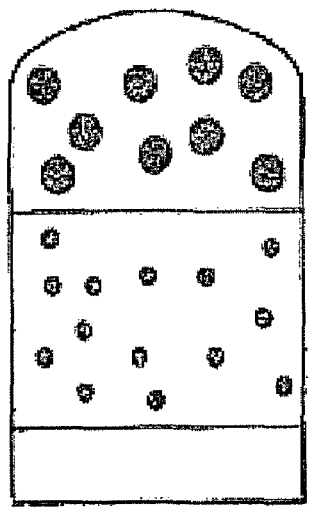

Hereinafter, the present invention will be described more fully with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise", "comprises", and "comprising," when used in this specification, specify the presence of stated features, integers, steps, operations, elements, components, and/or combination of the foregoing, but do not preclude the presence and/or addition of one or more other features, integers, steps, operations, elements, components, groups, and/or combination of the foregoing.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
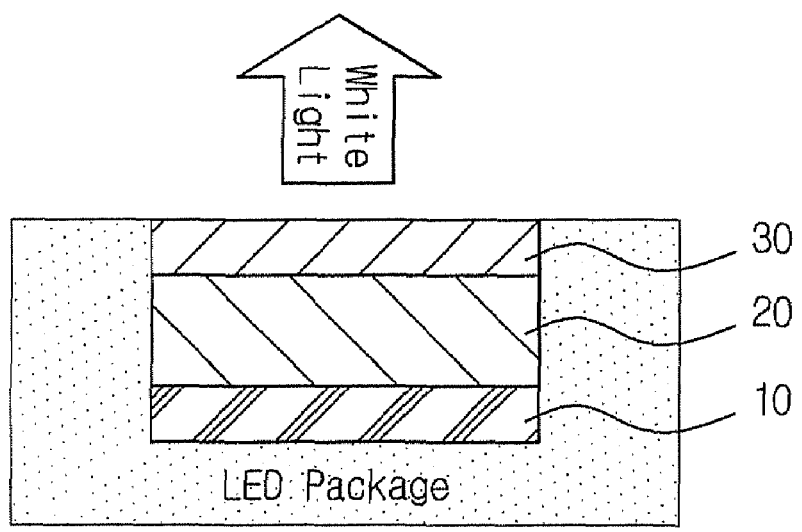
FIG. 3 is a schematic cross-sectional view showing the white LED, according to an exemplary embodiment of the present invention.

FIG. 3 is a schematic cross-sectional view showing the multilayered white LED according to an exemplary embodiment of the present invention.

As shown in FIG. 3, the exemplary embodiment of the multilayered white light emitting diode ("LED") of the present invention comprises an ultra violet ("UV") LED 10 for emitting UV light, a phosphor mixture layer 20 formed on the UV LED 10 and composed of a green phosphor and a blue phosphor to absorb UV light emitted from the UV LED and then respectively emit green light and blue light, and a red quantum dot layer 30 formed on the phosphor mixture layer 20. The red quantum dot layer 30 is composed of red quantum dots which are excited by blue light and green light emerging from the phosphor mixture layer 20 to emit red light.

In the present invention, the UV LED chip 10 is exemplified by a known LED chip capable of emitting light at a long UV wavelength of about 390 nanometers (nm) to about 410 nanometers (nm). In exemplary embodiment, an LED chip has $\lambda_{max}$ at about 400 nm.

The phosphor mixture layer 20 includes the blue phosphor, the green phosphor and an organic binder.

The green phosphor used in the present invention includes at least one selected from the group consisting of $BaMgAl_{10}O_{17}$:Eu,Mn, $Zn_2SiO_4$:Mn, $(Zn,A)_2SiO_4$:Mn (where A is an alkali earth metal), $MgAl_xO_y$:Mn (where x=an integer from 1 to 10 and y=an integer from 1 to 30), $LaMgAl_xO_y$:Tb (where x=an integer from 1 to 14 and y=an integer from 8 to 47), ReBO$_3$:Tb (where Re is at least one rare earth element selected from the group consisting of Sc, Y, La, Ce and Gd), and (Y,Gd)BO$_3$:Tb.

The blue phosphor of the present invention includes at least one selected from Sr(PO$_4$)$_3$Cl:Eu$^{2+}$, ZnS:Ag, Cl, CaMgSi$_2$O$_6$:Eu, CaWO$_4$:Pb and Y$_2$SiO$_5$:Eu.

The organic binder of the present invention includes cellulose polymers, such as methyl cellulose, acrylate polymers, such as polymethylmethacrylate, epoxy polymers and polyvinylalcohol polymers.

In the present invention, the absorption of light by the quantum dots occurs more strongly in the blue phosphor than in the green phosphor, and thus the green phosphor and the blue phosphor included in the phosphor mixture layer 20 are preferably mixed at a weight ratio of 1:3, respectively.

Moreover, if excess phosphor is used, visible light emitted by UV light is shielded by phosphor particles and hence cannot be effectively provided. Consequently, the ratio of green and blue phosphors to organic binder ranges from about 1:1 to about 1:3.

The red quantum dot layer 30 of the present invention includes quantum dots capable of emitting red light and an organic binder.

The red quantum dots of the present invention are selected from the group consisting of Group II-VI compound semiconductor nanocrystals, including CdS, CdSe, CdTe, ZnS, ZnSe, ZnTe, HgS, HgSe and HgTe, Group III-V compound semiconductor nanocrystals, including GaN, GaP, GaAs, InP and InAs, and mixtures of the foregoing Group II-VI or Group III-V compound semiconductor nanocrystals.

The organic binder of the present invention includes cellulose polymers, such as methyl cellulose, acrylate polymers, such as polymethylmethacrylate, epoxy polymers and polyvinylalcohol polymers.

In exemplary embodiments, the weight ratio of red quantum dots to organic binder is about 1:10000. Further, the red quantum dot layer 30 of the present invention has a thickness of about 3 millimeters (mm) or less.

The white LED of the present invention can exhibit high luminance and thus can be applied to backlight units of liquid crystal displays ("LCDs"), light sources for illumination and automobile illuminators.

Below an exemplary embodiment of a method of fabricating such a multilayered white LED of the present invention is described.

Figure 4:
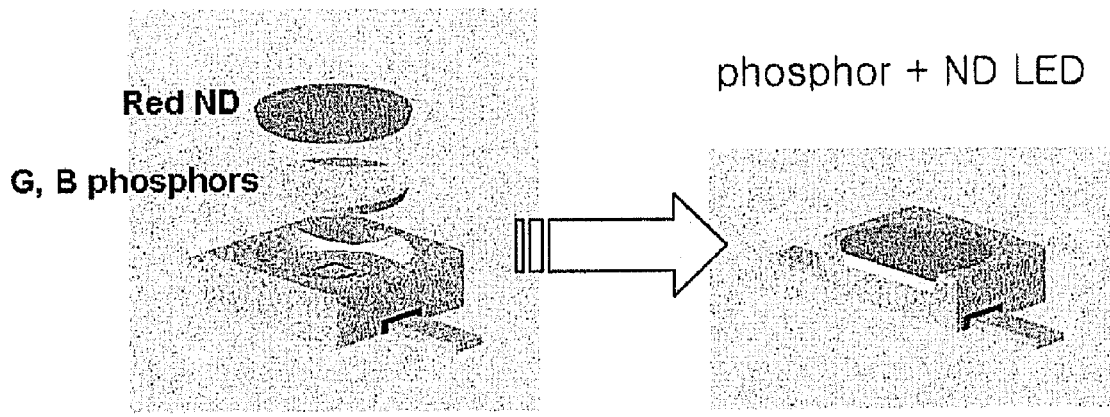
FIG. 4 is a perspective view showing the process of fabricating the white LED, according to an exemplary embodiment of the present invention.

FIG. 4 is a perspective view showing the process of fabricating the multilayered white LED of the present invention.

The method of fabricating such a multilayered white LED includes (a) forming a phosphor mixture layer 20 (FIG. 3) for emitting green light and blue light on a UV LED chip 10 (FIG. 3) for emitting UV light, and (b) forming a red quantum dot layer 30 on the phosphor mixture layer 20 (FIG. 3).

<(a) Formation of Phosphor Mixture Layer on UV LED Chip>

According to the method of the present invention, the phosphor mixture layer 20 is formed by mixing the green and blue phosphors with an organic binder solution composed of an appropriate organic solvent and an organic polymer or precursor thereof at a predetermined mixing ratio, applying the mixture on the LED chip 10 and drying it.

The green phosphor used in the fabrication method of the present invention includes at least one selected from the group consisting of BaMgAl$_{10}$O$_{17}$:Eu,Mn, Zn$_2$SiO$_4$:Mn, (Zn,A)$_2$SiO$_4$:Mn (where A is an alkali earth metal), MgAl$_x$O$_y$:Mn (where x=an integer from 1 to 10 and y=an integer from 1 to 30), LaMgAl$_x$O$_y$:Tb (where x=an integer from 1 to 14 and y=an integer from 8 to 47), ReBO$_3$:Tb (where Re is at least one rare earth element selected from the group consisting of Sc, Y, La, Ce and Gd), and (Y,Gd)BO$_3$:Tb.

The blue phosphor of the present invention includes at least one selected from Sr(PO$_4$)$_3$Cl:Eu$^{2+}$, ZnS:Ag, Cl, CaMgSi$_2$O$_6$:Eu, CaWO$_4$:Pb, and Y$_2$SiO$_5$:Eu.

Specific examples of the solvent, which is used in the preparation of the phosphor mixture layer 20 of the present invention, include α-terpineol, butyl carbitol acetate, and mixtures thereof, and specific examples of the organic polymer include cellulose polymers, such as ethyl cellulose or nitro cellulose, acrylate polymers, such as polyvinylbutyral or polymethylmethacrylate, epoxy polymers and polyvinylalcohol polymers.

The process of applying the phosphor is exemplified by drop casting, spin coating, dip coating, spray coating, flow coating, or screen printing, for example, but is not limited thereto.

The applied organic material is dried at about 80° C. to about 200° C., and preferably at about 100° C. to about 150° C., in order to ensure the stability of the phosphor.

<(b) Formation of Red Quantum Dot Layer on Phosphor Mixture Layer>

According to the method of the present invention, the quantum dot layer 30 is formed by dispersing red quantum dots in a binder solution using a silicon dispersant and then applying the dispersion on the phosphor mixture layer 20.

In the present invention, the quantum dot synthesis is not limited to the above-mentioned process, and any process known in the art may be applied. Below the preparation of the quantum dots using a chemical wet synthesis process is described in more detail.

The preparation of the quantum dots using the chemical wet synthesis process is conducted by adding a quantum dot precursor to an appropriate solvent in an inert atmosphere, such as nitrogen or argon, and allowing it to react.

The quantum dot precursor is obtained by separately adding a metal precursor and a chalcogenide precursor, and allowing them to react. Alternatively, the use of a single precursor is also known in the art.

Examples of the solvent used in the chemical wet synthesis process include C$_6$~C$_{22}$ alkyl phosphine, C$_6$~C$_{22}$ alkyl phosphine oxide, C$_6$~C$_{22}$ alkyl amine, and mixtures of at least one of the foregoing.

The quantum dots prepared through the chemical wet synthesis process include Group II-VI compound semiconductor nanocrystals, such as CdS, CdSe, CdTe, ZnS, ZnSe, ZnTe, HgS, HgSe and HgTe, Group III-V compound semiconductor nanocrystals, such as GaN, GaP, GaAs, InP and Inks, or mixtures of at least one of the foregoing Group II-VI or Group III-V compound semiconductor nanocrystals. In the case where the quantum dots are present in the form of a mixture of two or more materials, they may be present in a simple mixture, or in a manner such that the crystal structures of constituent materials thereof are divided to be included in the same particles, or in an alloy form.

In the present invention, the chemical wet synthesis process is conducted at about 150° C. to about 460° C., preferably at about 200° C. to about 420° C., and more preferably at about 230° C. to about 400° C., in order to easily grow crystals and ensure the stability of the solvent.

Further, the chemical wet synthesis process is conducted for a period of time ranging from about 1 minute to about 4 hours, preferably from 2 minutes to about 3 hours, and more preferably from about 3 minutes to about 2 hours.

Since the quantum dots, resulting from the chemical wet synthesis process, are dispersed in a colloidal state in the solvent, they are separated from the solvent using a centrifuge.

The quantum dots thus separated are dissolved in an appropriate solvent, such as toluene or hexane, applied on the phosphor mixture layer 20, and then burned, thus forming the red quantum dot layer 30.

A better understanding of the present invention may be obtained through the following examples, which are set forth to illustrate, but are not to be construed as limiting the present invention.

PREPARATIVE EXAMPLE 1

Synthesis of Red Quantum Dots 16 g of trioctylamine ("TOA"), 0.5 g of oleic acid ("OA"), and 0.4 mmol of cadmium oxide were introduced into a 125 ml flask equipped with a reflux condenser, after which the reaction temperature was increased to about 150° C. while maintaining the inside of the flask in a vacuum state. In that state, the reaction mixture was stirred at 700 rpm or faster to uniformly mix it. At 150° C., the vacuum atmosphere was converted into a nitrogen atmosphere, and the reaction temperature was further increased to 300° C. Separately, Se powder was dissolved in 97% pure trioctylphosphine ("TOP") to prepare an Se-TOP complex solution having about 0.2 M Se. 1 ml of the Se-TOP complex solution was rapidly added to the mixture stirred at 300° C. and then allowed to react for about 4 minutes. Thereafter, 1 milliliter (ml) of 0.2 M n-octane thiol solution in TOA was rapidly added to the reaction mixture and then allowed to react for about 30 minutes. During the reaction, the stirring rate and the nitrogen atmosphere were continuously maintained.

After the completion of the reaction, the resultant reaction solution was cooled to room temperature as quickly as possible and then added with ethanol as a non-solvent for centrifugation. Thereafter, the supernatant was decanted, and the remaining precipitate was dispersed in toluene.

EXAMPLE 1

Fabrication of Multilayered White LED

As a UV LED chip, a 400 nm $\lambda_{max}$ chip (commercially available from Photonix) was used.

A phosphor comprising (Ba,Eu) (Mg,Mn)$Al_{10}O_{17}$ (commercially available from Kasei Optonix) as a green phosphor and $Sr_4Al_{14}O_{25}$:Eu,Dy (commercially available from Nemoto & Co.) as a blue phosphor mixed at a weight ratio of 1:3 was blended with polydimethyl siloxane ("PDMS") (EG6301, commercially available from Dow Corning) at a weight ratio of 1:1, and then applied on the UV LED chip, thus forming a first film.

Subsequently, the CdSe red quantum dots ($\lambda_{max}$=589 nm) of Preparative Example 1 were dispersed in PDMS (EG6301, commercially available from Dow Corning) at a weight ratio of 1:10000 using a silicon dispersant, applied on the phosphor mixture layer and then burned, thus forming a second film.

EXPERIMENTAL EXAMPLE 1

The multilayered white LED thus fabricated was measured with respect to a change in spectrum over time under the following conditions.

Driving Current: 350 mA

Cooling: Sufficient cooling using a thermoelectric cooler

Measurement: Measurement for 38 hours at 1 min intervals

Figure 5:
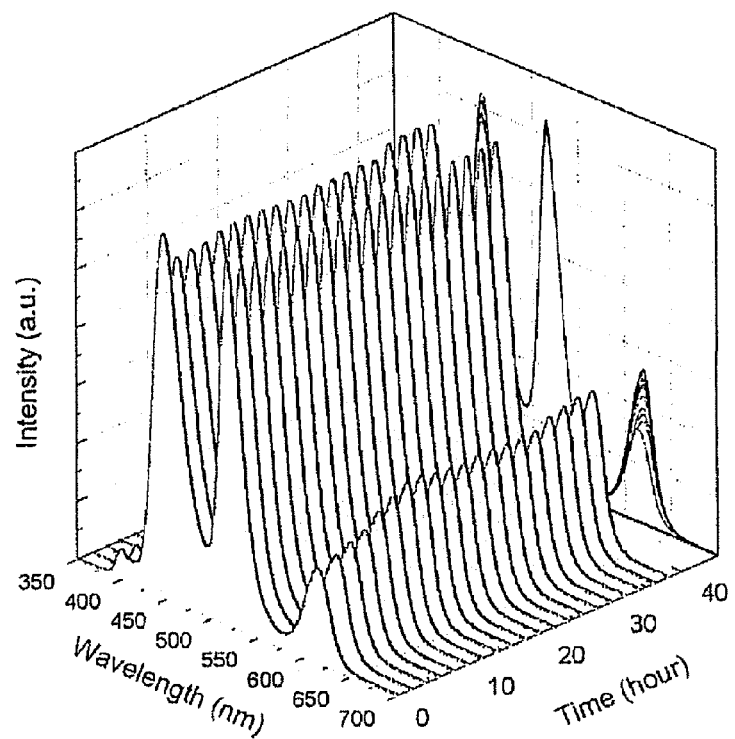
FIG. 5 is a three-dimensional graph showing the emission spectrum of the white LED of the present invention.

The results are given in FIG. 5. As shown in FIG. 5, the luminescence efficiency in response to the quantum dots increased over time and then stabilized, instead of decreasing as in the case of UV light. That is, a blue shift phenomenon, due to the reduction in the size of the quantum dots by UV light, was not observed.

Further, as is apparent from FIG. 5, the white LED of the present invention was confirmed to have distinct blue, green and red wavelengths and to realize stable white light through the emission of red light from the red quantum dots excited by visible light emerging from the blue and green phosphors.

EXPERIMENTAL EXAMPLE 2

In order to evaluate the stability of the quantum dots to UV light, the red quantum dots were mixed with PDMS, applied on the UV LED, and then measured with respect to the change in intensity of luminescence of the quantum dots upon initial driving and after 100 hours of driving under near UV light of about 400 nm. The results are given in FIG. 6.

Figure 6:
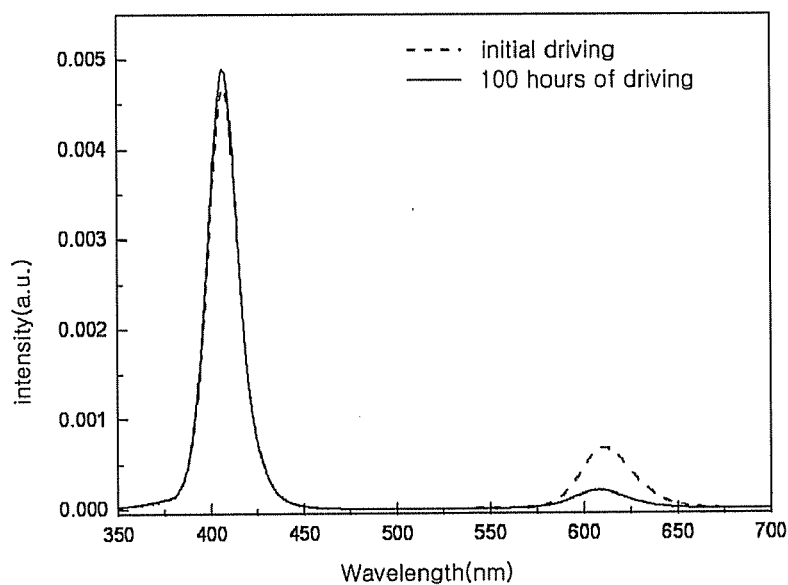
FIG. 6 is a two-dimensional graph showing the change in intensity of luminescence of quantum dots over time upon excitation of the quantum dots by UV light.

As shown in FIG. 6, after the 100 hours of driving, the intensity did not change in the UV wavelength range, but the luminescence of the red quantum dots was drastically decreased, and thus the peak emission wavelength was blue shifted.

That is, in the case of semiconductor nanoparticles having a CdSe core, they were confirmed to have stability problems, such as change of peak emission wavelength and low luminescence efficiency in the UV light range of about 390 nm to about 410 nm.

EXPERIMENTAL EXAMPLE 3

Evaluation of Luminescence of Quantum Dots by Visible Light and Stability Thereof The luminescence and stability of the quantum dots were evaluated using blue light having energy lower than UV light in order to solve the above problems.

Figure 7:
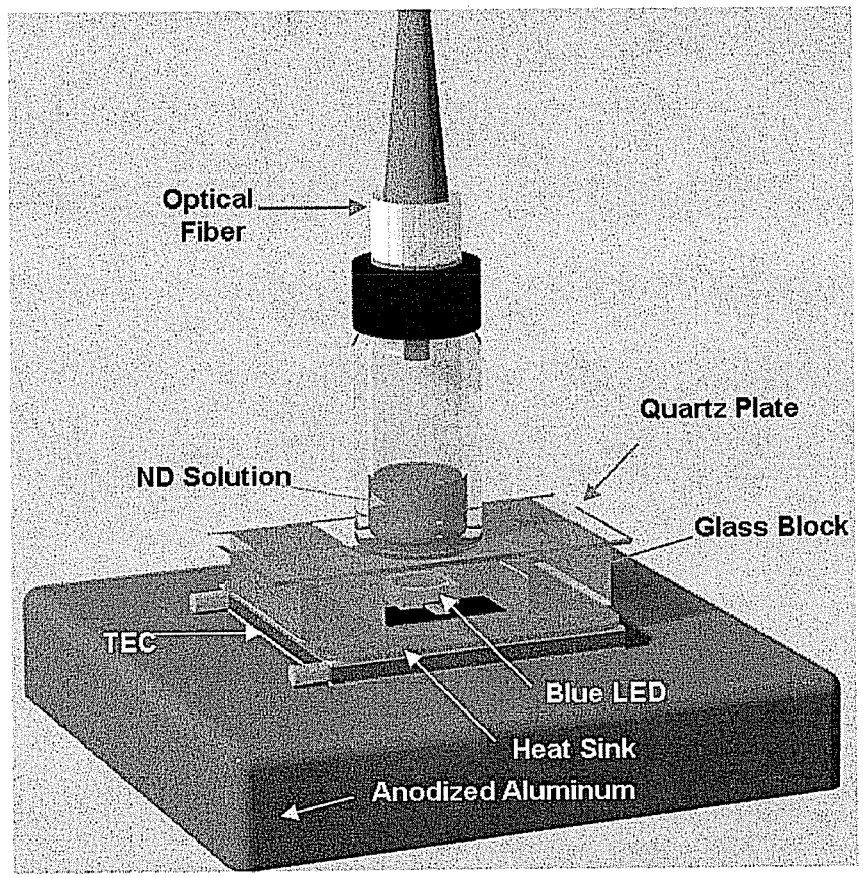
FIG. 7 is a schematic perspective view showing an experimental instrument for evaluating luminescence of the quantum dots using blue light and showing stability thereof.

FIG. 7 is a schematic perspective view showing the structure of a device used for the evaluation.

The evaluation conditions and the specification of a sample used in the evaluation were as follows.

Blue LED: OSRAM LB W5SG

Driving current: 500 mA

Emission $I_{max}$=462 nm

Sample: Red quantum dots (CdSe) mixed toluene solution

Quantum Dots (two type): A self-produced product (code: SAIT-1) and a commercially available product (trade name: EviDots™)

The intensity of luminescence of the quantum dots varying with time under the above conditions was measured. The results are given in FIGS. 8A and 8B.

Figure 8A:
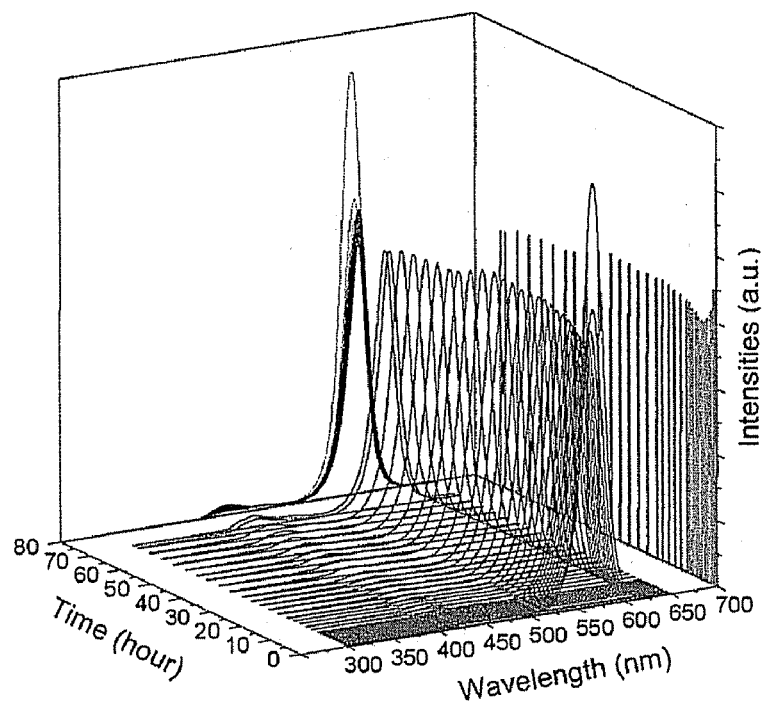
FIGS. 8A and 8B are three-dimensional graphs showing the change in intensity of luminescence of the quantum dots over time upon excitation of the quantum dots by blue light.

FIG. 8A is a graph showing the change in luminescence of the self-produced quantum dots (SAIT-1) over time (e.g., observation for 71.5 hours). As shown in FIG. 8A, although a very small decrease (increase in the amount of unabsorbed light) of the absorption of light excited at 462 nm by the quantum dots was observed, the light intensity was maintained in a state of being red shifted by about 6 nm after the decrease in the initial light intensity. That is, there was no drastic decrease in light intensity due to the UV excitation.

Figure 8B:
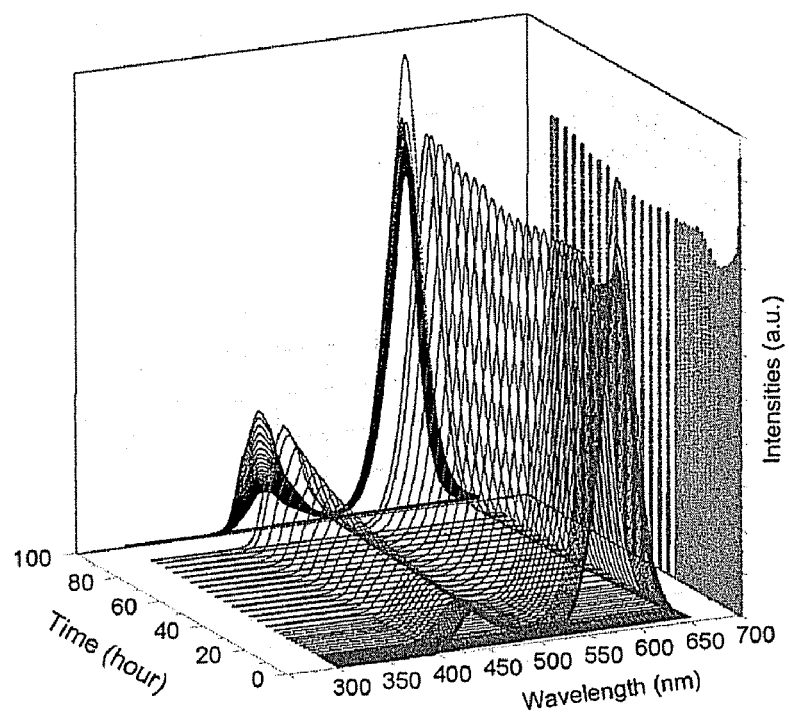

FIG. 8B is a graph showing the change in luminescence of the commercially available quantum dots (EviDots™) over time (e.g., observation for 86 hours). As shown in FIG. 8B, although a very small decrease (increase in the amount of unabsorbed light) of the absorption of light excited at 462 nm by the quantum dots was observed, the light intensity was restored in a state of being blue shifted by about 3 nm after the decrease in the initial light intensity. That is, there was no drastic decrease in the light intensity due to the UV excitation upon the excitation of the quantum dots by visible light.

As described hereinbefore, the present invention provides a multilayered white LED using quantum dots and a method of fabricating the same. In the white LED of the present invention, the quantum dots are not directly excited by UV light but are excited by visible light emerging from the phosphors so as to emit light, thereby maintaining high output of the LED and increasing the stability thereof, which has been impossible to ensure using UV light.

Further, the white LED of the present invention can be widely used as a light source having high output and high efficiency capable of replacing a backlight unit of an illumination device or display device as a result of the above properties.

Although the exemplary embodiments of the present invention have been disclosed for illustrative purposes, those skilled in the art will appreciate that various modifications, additions and substitutions are possible, without departing from the scope and spirit of the present invention as disclosed in the accompanying claims.

What is claimed is:

1. A multilayered white light emitting diode comprising a UV light emitting diode for emitting UV light;
a phosphor mixture layer consisting essentially of a green phosphor, a blue phosphor and an organic binder, the phosphor mixture layer formed on the UV light emitting diode; and
a red quantum dot layer formed on the phosphor mixture layer.

2. The light emitting diode as set forth in claim 1, wherein the green phosphor comprises at least one selected from the group consisting of $BaMgAl_{10}O_{17}$:Eu,Mn, $Zn_2SiO_4$:Mn, $(Zn,A)_2SiO_4$:Mn (where A is an alkali earth metal), $MgAl_x O_y$:Mn (where x=an integer from 1 to 10 and y=an integer from 1 to 30), $LaMgAl_xO_y$:Tb (where x=an integer from 1 to 14 and y=an integer from 8 to 47), $ReBO_3$:Tb (where Re is a rare earth element selected from the group consisting of Sc, Y, La, Ce, and Gd) and $(Y,Gd)BO_3$:Tb.

3. The light emitting diode as set forth in claim 1, wherein the blue phosphor comprises at least one selected from the group consisting of $Sr(PO_4)_3Cl:Eu^{2+}$, ZnS:Ag, Cl, $CaMgSi_2O_6$:Eu, $CaWO_4$:Pb and $Y_2SiO_5$:Eu.

4. The light emitting diode as set forth in claim 1, wherein the phosphor mixture layer comprises the blue phosphor and the green phosphor mixed at a ratio of 3:1.

5. The light emitting diode as set forth in claim 1, wherein the red quantum dot layer comprises quantum dots selected from the group consisting of Group II-VI compound semiconductor nanocrystals, Group III-V compound semiconductor nanocrystals and mixtures thereof.

6. The light emitting diode as set forth in claim 5, wherein the Group II-VI compound semiconductor nanocrystals include CdS, CdSe, CdTe, ZnS, ZnSe, ZnTe, HgS, HgSe and HgTe, and the Group III-V compound semiconductor nanocrystals include GaN, GaP, GaAs, InP and InAs.

7. The light emitting diode as set forth in claim 1, wherein the red quantum dot layer has a thickness of 3 mm or less.

8. A method of fabricating a multilayered white light emitting diode, the method comprising:
forming a phosphor mixture layer on a UV light emitting diode chip which emits UV light, wherein the phosphor layer consists essentially of a green phosphor, a blue phosphor and an organic binder, and emits green light and blue light; and
forming a red quantum dot layer on the phosphor mixture layer.

9. The method as set forth in claim 8, wherein the forming the phosphor mixture layer is conducted using drop casting, spin coating, dip coating, spray coating, flow coating or screen printing.

10. The method as set forth in claim 8, wherein the phosphor mixture layer is dried at about 100° C. to about 150° C.

11. The method as set forth in claim 8, wherein a ratio of the blue phosphor and green phosphor to the organic binder is about 1:1 to about 1:3.

12. The method as set forth in claim 8, wherein the red quantum dot layer comprises a red quantum dot and an organic binder.

13. The method as set forth in claim 12, wherein a ratio of the red quantum dot to the organic binder is 1:10000.

* * * * *